(12) United States Patent
Yun et al.

(10) Patent No.: US 9,658,659 B2
(45) Date of Patent: May 23, 2017

(54) DISPLAY DEVICE

(71) Applicant: LG ELECTRONICS INC, Seoul (KR)

(72) Inventors: Seunghyun Yun, Seoul (KR); Sangsoo Lee, Seoul (KR); Hyunseok Hwang, Seoul (KR); Jangil Lee, Seoul (KR); Kwangsik Yoo, Seoul (KR); Youngdon Choi, Seoul (KR); Seokmin Hong, Seoul (KR); Kihoon Nam, Seoul (KR); Woohyuk Choi, Seoul (KR); Inkeun Ryu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 3 days.

(21) Appl. No.: 14/760,435

(22) PCT Filed: Jan. 10, 2014

(86) PCT No.: PCT/KR2014/000335
§ 371 (c)(1),
(2) Date: Jul. 10, 2015

(87) PCT Pub. No.: WO2014/109608
PCT Pub. Date: Jul. 17, 2014

(65) Prior Publication Data
US 2015/0355689 A1   Dec. 10, 2015

(30) Foreign Application Priority Data

Jan. 10, 2013  (KR) .................. 10-2013-0003119
Jan. 11, 2013  (KR) .................. 10-2013-0003313

(51) Int. Cl.
*G06F 1/20* (2006.01)
*H05K 7/20* (2006.01)
(Continued)

(52) U.S. Cl.
CPC .......... *G06F 1/20* (2013.01); *G02F 1/133308* (2013.01); *G02F 1/133382* (2013.01);
(Continued)

(58) Field of Classification Search
CPC ........ G06F 1/20; H05K 7/20963; H05K 5/03; H05K 5/02; H05K 5/0017; H05K 1/0203;
(Continued)

(56) References Cited

U.S. PATENT DOCUMENTS

| | | | |
|---|---|---|---|
| 2010/0066937 A1* | 3/2010 | Yamashita | G02B 6/0085 349/58 |
| 2012/0044650 A1* | 2/2012 | Kim | G02F 1/133308 361/718 |
| 2012/0112616 A1* | 5/2012 | Kim | H05K 7/20963 313/46 |
| 2012/0293719 A1* | 11/2012 | Negoro | G02B 6/0068 348/725 |
| 2013/0170116 A1* | 7/2013 | In | H05K 7/00 361/679.01 |
| 2013/0308074 A1* | 11/2013 | Park | G02B 6/0088 349/58 |
| 2013/0308340 A1* | 11/2013 | Que | G02F 1/133615 362/612 |
| 2014/0347567 A1* | 11/2014 | Ito | H04N 5/64 348/791 |
| 2014/0353623 A1* | 12/2014 | Yi | H01L 51/524 257/40 |

(Continued)

FOREIGN PATENT DOCUMENTS

JP   2009-157197 A   7/2009
KR   10-2008-0114661 A   12/2008
(Continued)

*Primary Examiner* — Anthony Haughton
*Assistant Examiner* — Yahya Ahmad
(74) *Attorney, Agent, or Firm* — Birch, Stewart, Kolasch & Birch, LLP

(57) ABSTRACT

A display device according to one embodiment of the present invention includes a display module, and a heat dissipation unit which is coupled to a rear side of the display module. The heat dissipation unit includes a core part including a plurality of hollow polygonal columns extending in a front/back direction, a front sheet which is coupled to a front portion of the core part, and a rear sheet which is coupled to a rear portion of the core part. The core part has a thickness of about 40% to about 60% in the front/back direction with respect to a total thickness of the heat dissipation unit in the front/back direction.

11 Claims, 5 Drawing Sheets

(51) Int. Cl.
　　　*H05K 5/00*　　　　(2006.01)
　　　*H05K 5/02*　　　　(2006.01)
　　　*H05K 5/03*　　　　(2006.01)
　　　*H05K 1/02*　　　　(2006.01)
　　　*G02F 1/1333*　　　(2006.01)

(52) U.S. Cl.
　　　CPC ......... *H05K 1/0203* (2013.01); *H05K 5/0004* (2013.01); *H05K 5/0017* (2013.01); *H05K 5/02* (2013.01); *H05K 5/03* (2013.01); *H05K 7/20963* (2013.01); *G02F 2001/133314* (2013.01)

(58) Field of Classification Search
　　　CPC ............ H05K 5/0004; G02F 1/133308; G02F 1/133382; G02F 2001/133314
　　　USPC ................................................ 361/688–723
　　　See application file for complete search history.

(56) References Cited

U.S. PATENT DOCUMENTS

2015/0293298 A1* 10/2015 Hirota .................. G02B 6/0085
　　　　　　　　　　　　　　　　　　　　　　　　　　　349/65

FOREIGN PATENT DOCUMENTS

| KR | 10-2011-0056966 A | 5/2011 |
| KR | 10-2012-0054280 A | 5/2012 |

* cited by examiner (a)          (b)

(a)

(b)

(c)

DISPLAY DEVICE

CROSS REFERENCE TO RELATED APPLICATIONS

This application is the National Phase of PCT International Application No. PCT/KR2014/000335, filed on Jan. 10, 2014, which claims priority under 35 U.S.C. 119(a) to Patent Application Nos. 10-2013-0003119 and 10-2013-0003313, filed in Republic of Korea on Jan. 10, 2013 and Jan. 11, 2013, all of which are hereby expressly incorporated by reference into the present application.

TECHNICAL FIELD

The present disclosure relates to a display device, and more particularly, to a display device having an improved heat dissipation structure.

BACKGROUND ART

As information society is developed, various needs for display devices are increasing. In response to these needs, these days, various kinds of display devices such as a liquid crystal display device (LCD), a plasma display panel (PDP), an electro luminescent display (ELD), and vacuum fluorescent display (VFD) are being studied and used.

Such a display device includes a display module that displays an image, a control board that controls the display device, and a PCB plate to which the control board is attached. Here, when heat generated from the control board while the display device operates is transferred to the display module, the display module may be deteriorated to reduce product life cycle and product reliability.

Therefore, a structure for preventing the heat generated from other components such as the control board from being transferred to the display module and diffusing heat generated from the display module is needed.

DISCLOSURE OF THE INVENTION

Technical Problem

Embodiments provide a display device capable of effectively diffusing heat generated from a display module and preventing heat generated from a component disposed at a rear side of the display module from being transferred to the display module.

Technical Solution

In one embodiment, a display device includes: a display module; and a heat dissipation unit coupled to a rear side of the display module, wherein the heat dissipation unit comprises: a core part comprising a plurality of hollow polygonal columns extending in a front-to-rear direction; a front sheet coupled to a front portion of the core part; and a rear sheet coupled to a rear portion of the core part, wherein a ratio of a thickness of the core part with respect to a total thickness of the heat dissipation unit in a front-to-rear direction is about 40% to about 60%.

The core part may have a honeycomb structure including a plurality of hollow hexagonal columns.

The display device may further include a mid-cabinet coupled to an outer portion of each of the display module and the heat dissipation unit; and a mid-cabinet accommodation part defined between an edge of the display module and an edge of the heat dissipation unit to allow a portion of the mid-cabinet to be inserted thereinto.

The mid-cabinet may include: an edge part extending from the outside of each of the display module and the heat dissipation unit in the front-to-rear direction; and an insertion part protruding and extending inward from the edge part, wherein the insertion part may be inserted into the mid-cabinet accommodation part.

The heat dissipation unit may have an edge having a thinner thickness in the front-to-rear direction, and the mid-cabinet accommodation part may be defined in a front side of the portion, which has the thinner thickness in the front-to-rear direction, of the heat dissipation unit The heat dissipation unit may have an outer portion that is stepped backward, and the mid-cabinet accommodation part is defined in a front side of the portion, which is stepped backward, of the heat dissipation unit.

The front sheet may include: a first bent part that is bent to extend rearward from an end of the core part; and a second bent part that is bent to extend outward from a rear end of the first bent part, wherein the mid-cabinet accommodation part may be defined in a front side of the first bent part.

The display device may further include an end block, wherein each of the front and rear sheets may have an end lengthily extending outward more than that of the core part, and the end block may be inserted between the front sheet and the rear sheet from the outside of the core part.

The end block may include: an inner part; and an outer part disposed outside the inner part, the outer part having a front surface that is stepped backward more than that of the inner part, wherein the mid-cabinet accommodation part may be defined in a front side of the outer part.

The display module may include: a display panel; and a back cover attached to a rear surface of the display panel, wherein the display panel may include an organic light-emitting display (OLED) panel.

The display device may further include a PCB plate coupled to a rear portion of the heat dissipation unit; and a rear cover coupled to a rear portion of the PCB plate to surround at least one portion of the PCB plate.

At least one of the front and rear sheets may include a metal material.

The rear sheet may have a thicker thickness in the front-to-rear direction than that of the front sheet.

The edge part may further protrude in the front-to-rear direction than the insertion part.

Advantageous Effects

According to the present disclosure, the display device may effectively dissipate heat without increasing volume and thickness thereof to improve product reliability. In particular, the heat generated from the display module may be diffused, and a phenomenon in which the heat generated from the components such as the control board disposed at the rear side of the display module is transferred to the display module may be prevented to prevent the product from being deteriorated and extend the product life cycle, thereby improving reliability.

MODE FOR CARRYING OUT THE INVENTION

Hereinafter, a display device according to an embodiment will be described with reference to the accompanying drawings.

Figure 1:
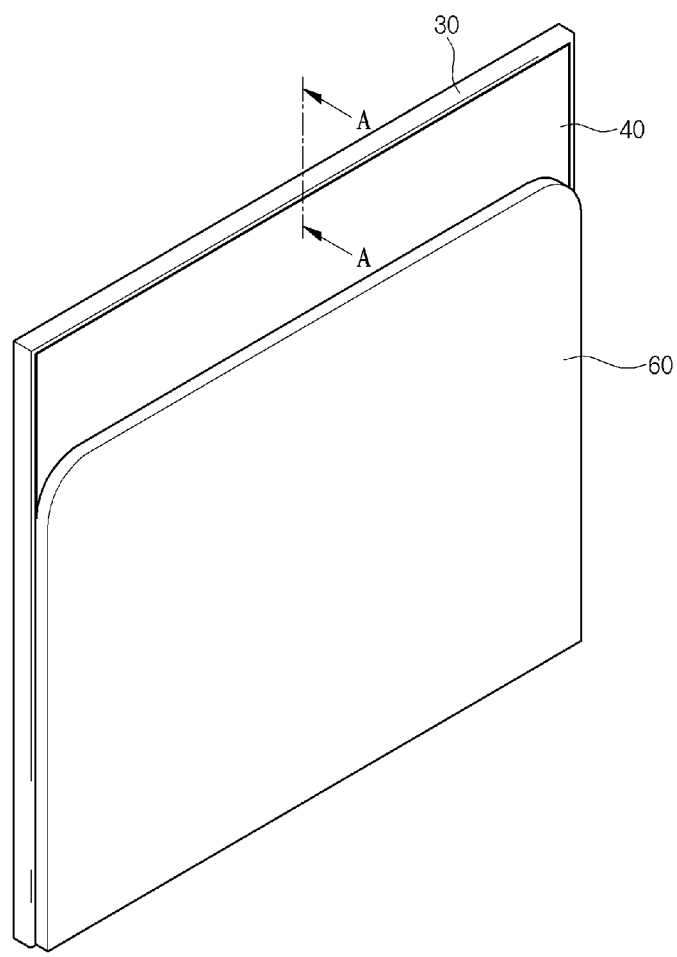
FIG. 1 is a perspective view of a portion of a display device when viewed from a rear side according to an embodiment.
Figure 2:
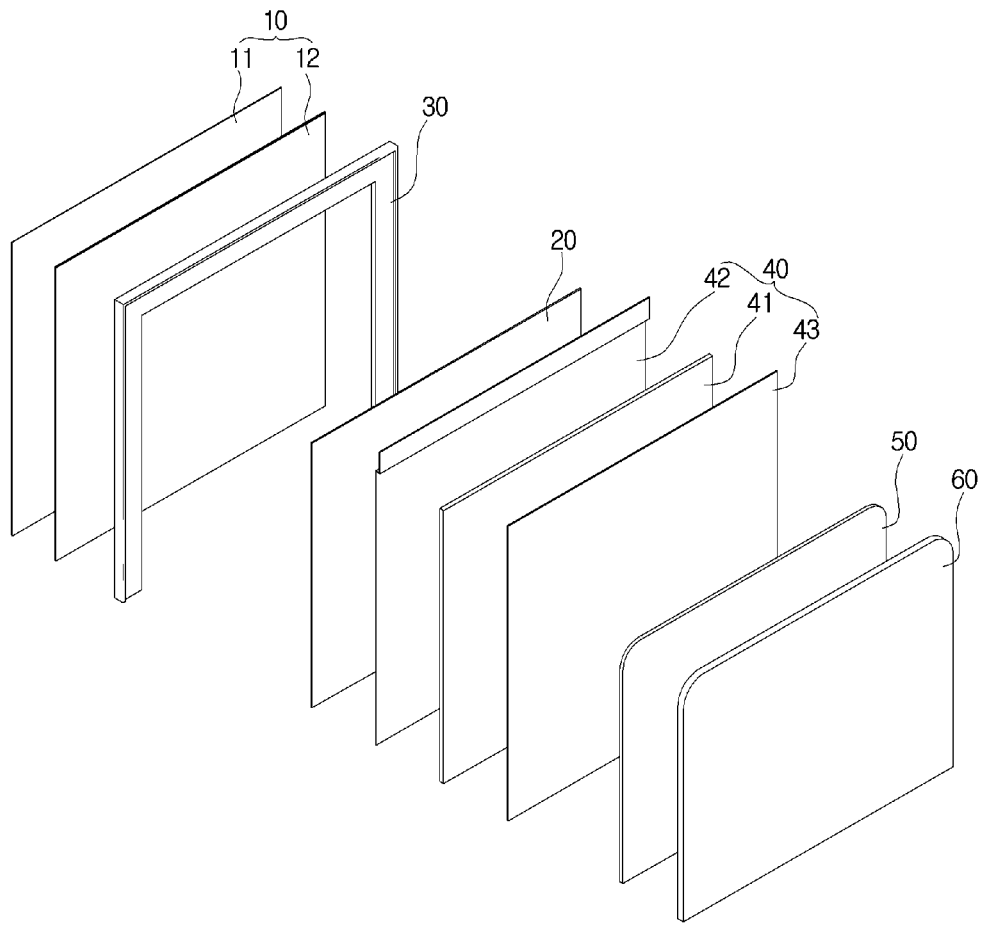
FIG. 2 is an exploded perspective view of the display device according to an embodiment.
Figure 3:
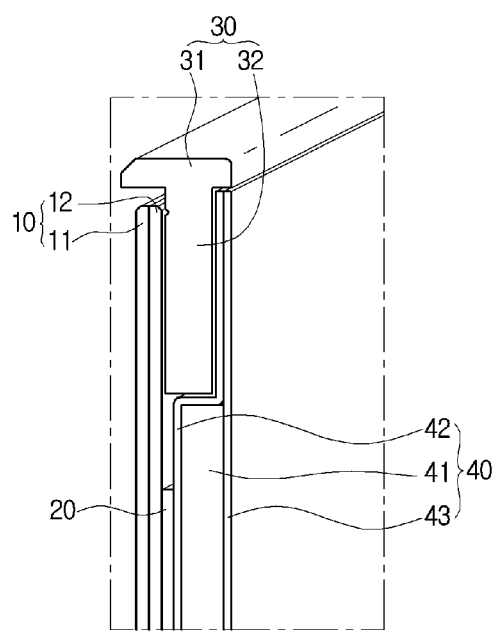
FIG. 3 is a cross-sectional perspective view of a portion of the display device taken along line AA of FIG. 1.
Figure 4:
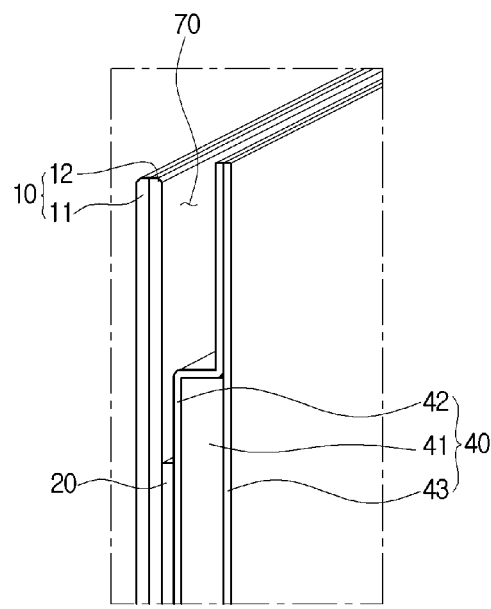
FIG. 4 is a view illustrating a state in which a mid-cabinet of FIG. 3 is removed.

FIG. 1 is a perspective view of a portion of the display device when obliquely viewed from a rear side according to an embodiment, and FIG. 2 is an exploded perspective view of the display device according to an embodiment, and FIG. 3 is a cross-sectional perspective view of a portion of the display device taken along line AA of FIG. 1, and FIG. 4 is a view illustrating a state in which a mid-cabinet of FIG. 3 is removed.

Referring to FIGS. 1 to 4, the display device according to an embodiment includes a display module 10 that is a portion on which an image is displayed, a heat dissipation unit 40 coupled at a rear side of the display module 10, a mid-cabinet 30 disposed at an outside of an edge of each of the display module 10 and the heat dissipation unit 40, a PCB plate 50 coupled to a rear portion of the heat dissipation unit 40, and a rear cover 60 coupled to a rear portion of the PCB plate 50.

In detail, first, the display module 10 includes a display panel 11 and a back cover 12 coupled to a rear surface of the display panel 11.

Here, the display panel 11 may be an organic light-emitting device (OLED) panel that displays an image by using the OLED.

The OLED has a structure in which a functional thin film type organic light-emitting layer is inserted between an anode and a cathode. A hole is injected from the anode, and an electron is injected from the cathode, and thus the electron is coupled to the hole in the organic light-emitting layer to form an exciton. Here, the OLED may emit light while the exciton is radiatively recombined.

As a method of realizing a full color OLED, there are independent light-emitting manner, a color filter manner, and a color conversion manner. The independent light-emitting manner is a manner in which each of red (R), green (G), and blue (B) light-emitting materials is thermally deposited by using a metal shadow mask having an elaborate pattern to realize red (R), green (G), and blue (B) colors. The color filter manner is a manner in which a white light-emitting layer is formed, and red (R), green (G), and blue (B) color filters are patterned on the white light-emitting layer to realize the red (R), green (G), and blue (B) colors. The color conversion manner is a manner in which a blue light-emitting layer is provided, and a color conversion layer for converting the blue color to green and red colors is used to realize the red (R), green (G), and blue (B) colors.

The back cover 12 is a plate shape member that is coupled to a rear portion of the display panel 11. The back cover 12 may be formed of a material that is capable of maintaining strength more than a predetermined level regardless of a relatively thin thickness, for example, carbon fiber-reinforced plastic (CFRP)

In the current embodiment, although the display module including the OLED panel is exemplarily described as the display module 10, the display module capable of being applied to the present disclosure is not limited to the display module 10 including the OLED panel. For example, the display module 10 may be provided with various types of display module 10 including an liquid crystal display (LCD) panel, a plasma display panel (PDP), or a field emission display panel.

The heat dissipation unit 40 is coupled at the rear side of the display module 10. The heat dissipation unit 40 may be attached to a rear surface of the display module 10 by an adhesion layer 20. That is, the heat dissipation unit 40 may be attached to a rear surface of the back cover 12. Here, the adhesion layer 20 may be a member having an adhesion force on both front and rear surfaces thereof, e.g., a double-sided tape.

Figure 7:
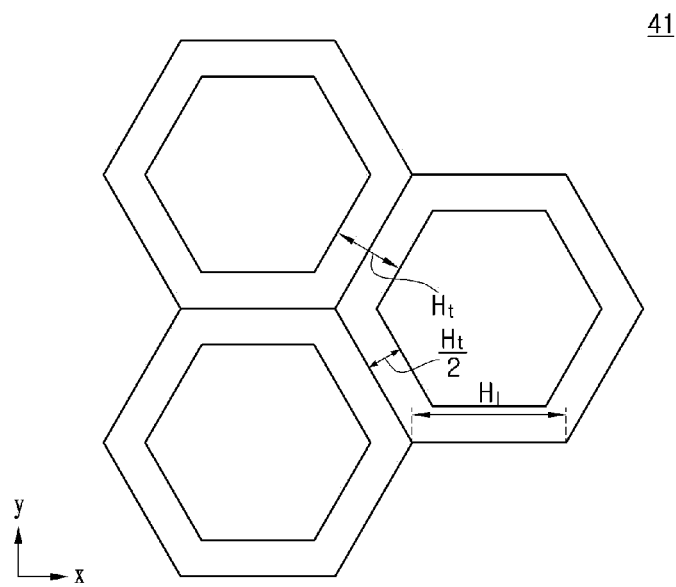
FIG. 7 is a cross-sectional view illustrating a portion of polygonal columns constituting a core of the heat dissipation unit.
Figure 8:
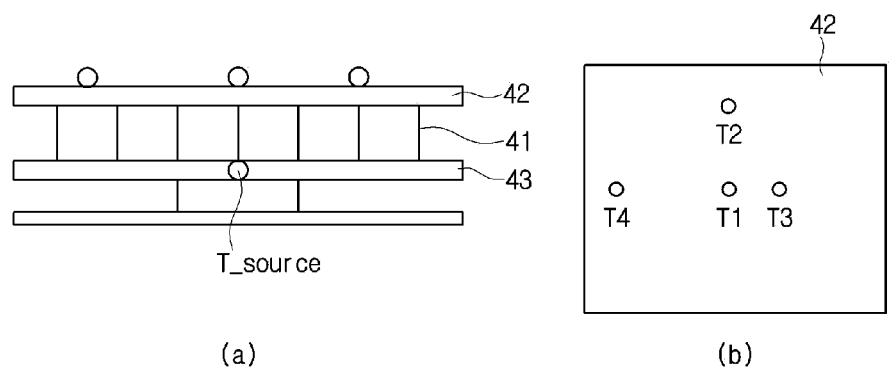
FIG. 8a is a schematic view of a position at which a thermal source is disposed when simulation is performed.
FIG. 8b is a view illustrating portions of a front sheet at which temperatures are measured when the simulation is performed.
Figure 9:
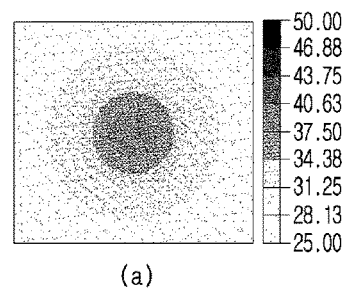
FIG. 9 is a view illustrating a surface temperature distribution of the front sheet by the simulation.
Figure 9:
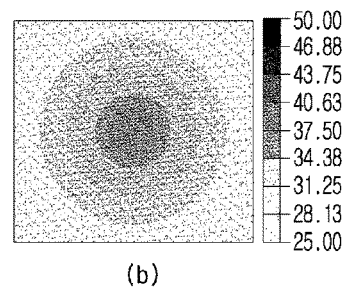
Figure 9:
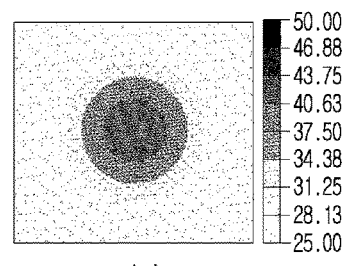

Constitutions of the heat dissipation unit 40 will be described in more detail. The heat dissipation unit 40 includes a core part 41, a front sheet 42 coupled to a front portion of the core part 41, and a rear sheet 43 coupled to a rear portion of the core part 41. As FIG. 7 illustrates a portion of a section of the core part 41, the core part 41 of the heat dissipation unit 40 has a shape in which a plurality of hollow polygonal columns extending front-to-rear direction are coupled to each other. Thus, when the core part 41 is viewed from a front side or a rear side, the core part 41 has a shape in which each of the plurality of polygonal shapes have one side contacting or sharing with that of the other polygonal shape.

That is, the core part 41 includes the plurality of polygonal columns, and one polygonal column has one side surface contacting or sharing with that of the other polygonal column that is adjacent thereto.

Hereinafter, a hollow hexagonal column will be described as an example of the polygonal column. However, the polygonal column constituting the core part of the heat dissipation unit is not limited to the hexagonal column, and for example, it may be understood that various shapes of columns such as a triangular column or a rectangular column is used.

For example, when the polygonal column is provided with the hexagonal column, it may be understood that one of six side surfaces constituting the hexagonal column contacts to be coupled to that of the other hexagonal column that is adjacent thereto, or the one hexagonal column shares one side surface thereof with the other hexagonal column adjacent thereto.

For example, in FIG. 7, if the side surface of the hexagonal column has a thickness $H_t$, it may be understood that the one hexagonal column shares the side surface thereof with the other hexagonal column that is adjacent thereto. Also, if the side surface of the hexagonal column has a thickness $H_t/2$, it may be understood that the one hexagonal column has one side surface contacting that of the other hexagonal column that is adjacent thereto, and thus the two hexagonal columns are integrally coupled to each other.

According to the above-described structure, since the inside of the hexagonal column of the core part 41 is filled with air, heat insulation effect may be secured. Also, when each of the front and rear sheets 42 and 43 is formed of a material having excellent thermal conductivity, thermal diffusion effect may be secured. Also, the hollow hexagonal column is lightweight and has excellent strength in a front-to-rear direction with respect to an external force.

Since the core part 41 of the heat dissipation unit 40 has a polygonal column shape such as the hexagonal column as described above, when the core part 41 is cut to match a size of a product in the manufacturing process, a section of an edge of the core part 41 may not be clearly aligned. Thus, since the heat dissipation unit 40 does not have an elegant outer appearance, there is a necessity to clearly finish the edge of the heat dissipation unit 40.

Figure 5:
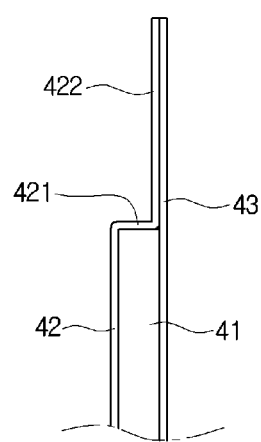
FIG. 5 is a side-sectional view illustrating one example of an outer end of a heat dissipation unit.
Figure 6:
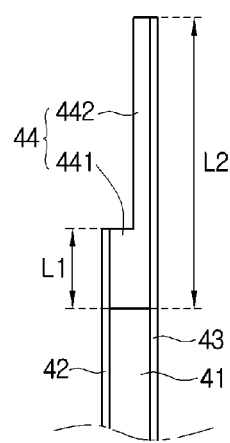
FIG. 6 is a side-sectional view illustrating another example of the outer end of the heat dissipation unit.

FIGS. 5 and 6 are side-sectional views illustrating an example in which an edge of the heat dissipation unit 40 is finished. The heat dissipation unit 40 has to be finished to clearly trim a side edge of the core part 41 and also to define a mid-cabinet accommodation part (see reference numeral 70 of FIG. 4) into which a portion of the mid-cabinet 30 that will be described later is inserted. The mid-cabinet accommodation part 70 is defined between the edge of the display module 10 and the edge of the heat dissipation unit 40. That is, the mid-cabinet accommodation part 70 may be defined between a rear portion of the back cover 12 and a front portion of the heat dissipation unit 40.

The edge of the heat dissipation unit 40 is stepped rearward. The mid-cabinet accommodation part 70 is defined in a front side of a portion of the heat dissipation unit 40, which is stepped rearward. That is, the heat dissipation unit 40 has the edge having a thinner thickness in the front-to-rear direction (hereinafter, referred to as a "front-rear thickness"), and the mid-cabinet accommodation part 70 is defined at the front side of the portion, which has a thinner front-rear thickness, of the heat dissipation unit 40.

Referring to FIG. 5, the core part 41 has a vertical length that is less than that of each of the front and rear sheets 42 and 43. That is, the core part 41 has an end that is disposed inward (a lower side in FIG. 5) than an end of each of the front and rear sheets 42 and 43. Also, the front sheet 42 includes a first bent part 421 that is bent to extend rearward from an end of the core part 41 at an approximately right angle and a second bent part 422 that is bent to extend outward from a rear end of the first bent part 421 at the approximately right angle. The second bent part 422 may extend in parallel with the rear sheet 43. Here, a rear surface of the second bent part 422 may contact to be coupled to a front edge of the rear sheet 43.

Here, a space between the second bent part 422 of the front sheet 42 and the display module 10 may define the mid-cabinet accommodation part 70 as illustrated in FIG. 4. The mid-cabinet accommodation part 70 is a space in which an insertion part 32 of the mid-cabinet 30 that will be described later is inserted.

That is, the heat dissipation unit 40 is stepped rearward from an outer portion that is an end of the core part 41 and the stepped portion has a thinner front-rear thickness. Here, the stepped space may define the mid-cabinet accommodation part 70.

FIG. 6 is a side-sectional view illustrating another example in which the edge of the heat dissipation unit 40 is finished. Referring to FIG. 6, the front sheet 42 extends slightly longer than the core part 41, and the rear sheet 43 extends longer than the front sheet 42. Thus, the core part 41 has the shortest length, and the rear sheet 43 has the longest length, and the front sheet 42 has a length between the length of the core part 41 and the length of the rear sheet 43. In this structure, an end block 44 is fitted between the front sheet 42 and the rear sheet 43.

The end block 44 includes an inner part 441 and an outer part 442. The inner part 441 of the end block 44 is a portion having a thicker front-rear thickness. Also, the outer portion 442 is disposed outside when compared to the inner part 441 (an upper side in FIG. 6) and has a thinner front-rear thickness than that of the inner part 441. Here, the inner and outer parts 441 and 442 have rear surfaces disposed on approximately the same plane and front surfaces stepped rearward at the side of the outer part 442. Here, a space in front of the stepped outer part 442 defines the mid-cabinet accommodation part 70.

When a length in which the front sheet 42 further extends outward from a predetermined edge thereof than the core part 41 is called L1, and a length in which the rear sheet 43 further extends outward from a predetermined edge thereof than the core part 41 is called L2, the inner part 441 of the end block 44 has the length L1, and the outer part 442 has the length L2−L1.

The mid-cabinet 30 is coupled to the outer edge of each of the display module 10 and the heat dissipation unit 40, which have the above-described constitutions. As illustrated in FIG. 2, the mid-cabinet 30 may have a structure coupled to an upper end, and left and right ends of each of the display module 10 and the heat dissipation unit 40. However, additionally, the mid-cabinet 30 may have an approximately rectangular shape so that the mid-cabinet 40 is coupled to a lower end of each of the display module 10 and the heat dissipation unit 40. As illustrated in FIG. 3, the mid-cabinet 30 includes an edge part 31 extending in the front-to-rear direction and an insertion part 32 protruding inward from the edge part 31. The edge part 31 is a portion defining an outer edge of the display device. The edge part 31 may have a rear end that extends to the same point as that of a rear surface of the rear sheet 43 of the heat dissipation unit 40 and also further extends to a rear side of the same point. Also, the edge part 31 may have a front end that extends to the same point as that of the front surface of the display panel 11 and also further extends to a front side of the same point. The insertion part 32 may protrude and extend inward from a point of the center of the edge part 31. The insertion part 32 may have width in the front-to-rear direction (hereinafter, referred to as a "front-rear width") that is approximately the same as that between the display module 10 and the second bent part 422 of the front sheet 42. That is, the insertion part 32 has the front-rear width that is approximately the same as that of the mid-cabinet accommodation part 70. This is because the insertion part 32 is inserted into the mid-cabinet accommodation part 70 that is a space between the display module 10 and the second bent part 422 of the front sheet 42.

Thus, the edge part 31 may have a shape further protruding in the front-to-rear direction than the insertion part 32.

However, when the heat dissipation part 40 is finished as illustrated in FIG. 6, the mid-cabinet accommodation part 70 is a space between the display module 10 and the outer part 442 of the end block 44, and thus the insertion part 32 may have the front-rear thickness that is approximately the same as that between the display module 10 and the outer part 442.

When the core of the heat dissipation unit 40 is constituted by a plurality of hollow hexagonal columns, the heat dissipation unit 40 may have heat dissipation performance that varies depending on a ratio of a length of one side of a hexagonal shape defining a section of hexagonal column to a thickness of one side of the hexagonal column. Also, the heat dissipation performance may vary depending on a ratio of a thickness of the core part 41 to a thickness of each of the front and rear sheets 42 and 43, which constitute the heat dissipation unit 40. The relation between the size of the heat dissipation unit 40 and the heat dissipation performance will be described in detail later.

The PCB plate 50 is coupled to the rear surface of the heat dissipation unit 40. A control board (not shown) having various functions may be coupled to the PCB plate 50. For example, a power supply unit that converts power to driving power for driving the display module 10, a main control board that generates an image signal for driving the display module 10, and a timing controller (T-con) board may be coupled to the PCB plate 50.

The rear cover 60 is disposed on the rear portion of the PCB plate 50 to surround and protect the PCB plate 50 and the control board coupled to the PCB plate 50. Thus, the rear cover 60 has upper/lower/right/left edges that further protrude to the front side to define a space between upper/lower/right/left edges so that the control board coupled to the PCB plate 50 is disposed. The rear cover 60 has a front end that contacts to be coupled to the rear surface of the heat dissipation unit 40. However, the front end of the rear cover 60 may contact to be coupled to a rear surface of the PCB plate 50.

Hereinafter, the relation between the size of the heat dissipation unit 40 and the heat dissipation performance will be described with reference to FIGS. 7 to 10. Here, for example, the core part 41 has a honeycomb structure having a hexagonal section as illustrated in FIG. 7.

When a width of one side of the hexagonal section of the core part 41 is $H_t$, and an average length of the one side of the hexagonal section of the core part 41 is $H_1$, β that is a ratio of the $H_t$ to $H_1$ may be expressed by the following equation.

$$\beta = \frac{Ht}{Hl}$$

For reference, in the above relation, if the width $H_t$ is fixed, and the length $H_1$ increases, β decreases. Thus, the thermal insulation effect increases, but strength of the core part is weakened, and the core part 41 increases in size and has a poor outer appearance. If the width $H_t$ is fixed, and the length $H_1$ decreases, β increases. Thus, the strength of the core part increases but the thermal insulation effect decreases. If the length $H_1$ is fixed, and the width $H_t$ increases, β increases, and thus the thermal insulation effect decreases. If the length $H_1$ is fixed, and the width $H_t$ decreases, β decreases. Thus, although the strength of the core part is weakened as the thickness of the column decreases, the thermal insulation effect increases. That is, when β has a small value, the thermal insulation effect increases, and thus it may be preferable that even if β is minimized, the strength increases in consideration of the size and thickness of the core part 41.

The heat dissipation unit 40 may have thermal insulation performance because of an air pocket that is disposed inside the core part 41. For reference, air has a thermal conductivity coefficient of about 0.026 W/mK. A theoretical thermal insulation limitation of the heat dissipation unit 40 may exceed the thermal conductivity coefficient of the air. The thermal conductivity coefficient of the heat dissipation unit 40 according to the β value is shown as follows. The following Table 1 shows a case in which the core part 41 is formed of aluminum (Al) having a thermal conductivity coefficient of about 150 W/mK.

TABLE 1

| B value | Ht [mm] | Hl [mm] | Thermal transfer coefficient [W/mK] |
|---|---|---|---|
| 0.02 | 0.08 | 4 | 3.4441 |
| 0.05 | 0.2 | 4 | 8.5352 |

The aluminum (Al) may be lightweight to increase specific strength. When β is about 0.02 to about 0.05, the aluminum (Al) may have the optimal thermal transfer performance.

When the core part 41 is formed of the same material as that of each of the front and rear sheets 42 and 43, deformation due to a difference of a thermal expansion coefficient may be prevented. For example, when the core part 41, the front sheet 42, and the rear sheet 43 are formed of aluminum (Al), deformation due to differences of the thermal expansion coefficients of the core part 41, the front sheet 42, and the rear sheet 43 may be prevented.

FIG. 8a is a schematic view of a position at which a thermal source is disposed when simulation is performed, and FIG. 8b is a view illustrating portions of a front sheet at which temperatures are measured when the simulation is performed.

In three cases in which the front sheet 42, the core part 41, and the rear sheet 43 have thicknesses different from each other, when heat is applied from the rear side, a temperature of each point on the front sheet 42 is simulated.

Here, a condition of the simulation is described in detail. First, a specimen constituting the heat dissipation unit 40 has a size of about 100×00 mm$^2$, and the core part 41 has thickness of about 2.7 mm. The simulation is performed while changing the thicknesses of the front and rear sheets 42 and 43. A thermal source area is about 14×18 mm$^2$, and input power has a heat generation amount of about 5 W. The thermal conductivity coefficient has been calculated by the average length $H_1$ of about 3.7005 mm and the width $H_t$ of about 0.06 mm. And, the calculated thermal conductivity of Kx=1.292 W/mK in an x direction, the thermal conductivity of Ky=1.292 W/mK in a y direction, and thermal conductivity of Kz=2.592 W/mK in a z direction are applied. As the material, A150-based metal having thermal conductivity of K1=138 W/mK is used.

Table 2 shows thickness of the front sheet 42, the core part 41, and the rear sheet 43 in three cases of case 1, case 2, and case 3.

TABLE 2

|  | Case 1 | Case 2 | Case 3 |
|---|---|---|---|
| Front sheet [mm] | 0.8 | 0.2 | 0.2 |
| Core part [mm] | 2.7 | 2.7 | 2.7 |
| Rear sheet [mm] | 0.2 | 0.8 | 0.2 |

The following Table 3 shows a simulation result.

TABLE 3

|  | Case 1 | Case 2 | Case 3 |
|---|---|---|---|
| Thermal source (T source) | 52.2177 | 50.5565 | 54.3681 |

TABLE 3-continued

|   | Case 1 | Case 2 | Case 3 |
|---|--------|--------|--------|
| T1 | 48.9928 | 49.6037 | 51.5236 |
| T2 | 46.3873 | 46.8215 | 45.5373 |
| T3 | 47.1202 | 47.5927 | 46.8424 |
| T4 | 46.3419 | 46.7799 | 45.3718 |

Referring to Table 3, in case 1, case 2, and case 3, the maximum temperature differences of about 2.65° C. (between a point T1 and a point T4), about 2.82° C. (between the point T1 and the point T4), and about 6.15° C. (between the point T1 and the point T4) are generated, respectively. It can be seen that in case 1 and case 2, temperature differences between the points T1 to T4 are relatively low, and in case 3, temperature differences between the points T1 to T4 are relatively high.

FIGS. 9a, 9b, and 9C show the simulation results. In more detail, when the thermal source is disposed at the rear side of the rear sheet 43, surface temperature distribution on the front sheet 42 is shown. FIG. 9a shows case 1, and FIG. 9b shows case 2, and FIG. 9c shows case 3.

It can be seen that in case 1 and case 2, diffusion performance of the surface temperature is relatively excellent, and on the other hand, in case 3, thermal diffusion is not properly performed, and a central portion of the front sheet has a high temperature. That is, in case 3, the thermal diffusion performance is poor. Thus, it can be seen that as the front sheet 42 or the rear sheet 43 has the thicker thickness, the thermal diffusion performance is excellent.

Also, when the rear sheet 43 has the thicker thickness, it can be seen that the thermal diffusion performance increases. There is no significant differences between a temperature deviation of the points T1 to T4 in case 1 and a temperature deviation of the points T1 to T4 in case 2. However, the temperature in the thermal source is relatively low in case 2. Thus, as case 2, when the rear sheet 43 has the thick thickness, it may be more efficient than when the front sheet 42 has the thick thickness.

Also, since other components such as the PCB plate 50 are coupled to the rear sheet 43, when the rear sheet 43 has the thicker thickness, product durability may be secured.

Hereinafter, the optimal combination ratio of the core part 41, the front sheet 42, and the rear sheet 43 will be described with reference to FIG. 10.

Figure 10:
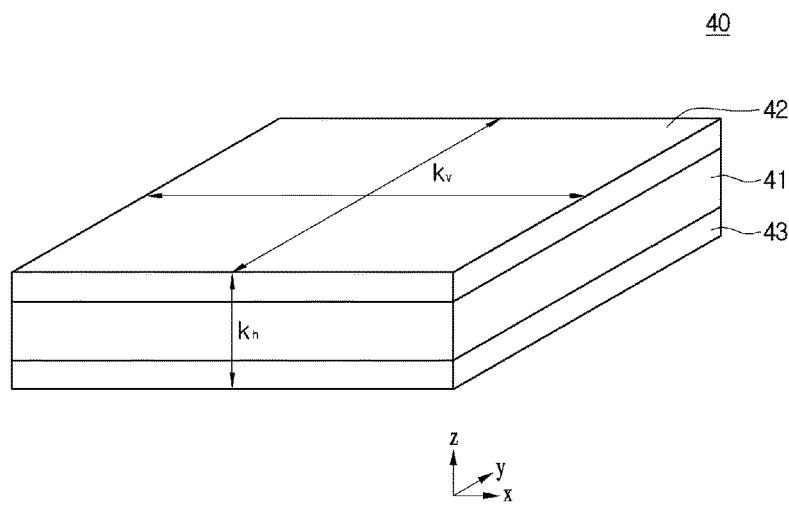
FIG. 10 is a schematic view of the heat dissipation unit.

FIG. 10 is a schematic view of the heat dissipation unit 40. When a thermal transfer coefficient of the heat dissipation unit 40 in a plane direction, i.e., in an upper/lower/left/right direction, is $K_v$, and a thermal transfer coefficient in a thickness direction, i.e., in the front-to-rear direction, is $K_h$, the greater the thermal transfer coefficient $K_v$ is, the better, and also the smaller the thermal transfer coefficient $K_h$ is, the better.

As the thermal transfer coefficient $K_v$ increases, the thermal diffusion performance is excellent, and as the thermal transfer coefficient $K_h$ decreases, the thermal insulation performance is improved. Thus, the heat dissipation unit 40 may have excellent thermal insulation performance in the thickness direction (the front-to-rear direction) and excellent thermal diffusion performance in the plane direction (the upper/lower/left/right direction).

The following Table 4 shows correlation of the thickness of the core part 41 with respect to a total thickness of the heat dissipation unit 40 and thermal diffusion performance that is a value of the thermal transfer coefficient Kh with respect to the thermal transfer coefficient Kv.

TABLE 4

| Core part thickness/Heat dissipation unit thickness | $K_v/K_h$ |
|---|---|
| 0.1 | 4.74 |
| 0.2 | 8.78 |
| 0.3 | 9.68 |
| 0.4 | 10.9 |
| 0.5 | 11.27 |
| 0.6 | 10.80 |
| 0.7 | 9.49 |
| 0.8 | 7.33 |
| 0.9 | 4.36 |

As a value of the thermal transfer coefficient Kv/the thermal transfer coefficient Kh increases, the heat may be diffused better to improve heat dissipation performance.

Referring to Table 4, when a value of the thickness of the core part 41/the thickness of the heat dissipation unit 40 is about 0.4 to about 0.6, it can be seen that the value of the thermal transfer coefficient Kv/the thermal transfer coefficient Kh is more than about 10.

Thus, when the core part 41 has a thickness of about 40% to about 60% with respect to the total thickness of the heat dissipation unit 40, it can be seen that the heat dissipation unit 40 has excellent heat dissipation performance.

Since the display device according to an embodiment has the above-described structure, thermal diffusion may be effectively performed in the display module 10 including the display panel 11. Also, a phenomenon in which the heat is transferred from the PCB plate at the rear side of the display module 10 toward the display module 10 may be prevented.

The invention claimed is:

1. A display device comprising:
   a display module;
   a heat dissipation unit coupled to a rear side of the display module;
   a mid-cabinet disposed between the display module and the heat dissipation unit;
   a PCB plate coupled to a rear portion of the heat dissipation unit; and
   a rear cover coupled to a rear portion of the PCB plate to cover the PCB plate,
   wherein the heat dissipation unit comprises:
      a core part comprising a plurality of hollow polygonal columns extending in a front-to-rear direction;
      a front sheet coupled to a front portion of the core part; and
      a rear sheet coupled to a rear portion of the core part,
   wherein the heat dissipation unit has an edge portion that is stepped backward from a front surface thereof to define a mid-cabinet accommodation part, and
   wherein a portion of the mid-cabinet is disposed in the mid-cabinet accommodation part.

2. The display device according to claim 1, wherein the core part has a honeycomb structure comprising a plurality of hollow hexagonal columns.

3. The display device according to claim 1, wherein the mid-cabinet comprises:
   an edge part extending in the front-to-rear direction from the outside of each of the display module and the heat dissipation unit; and
   an insertion part protruding and extending inward from the edge part,
   wherein the insertion part is inserted into the mid-cabinet accommodation part.

4. The display device according to claim 3, wherein the edge part further protrudes in the front-to-rear direction than the insertion part.

5. The display device according to claim 1, wherein the front sheet comprises:

a first bent part that is bent to extend rearward from an end of the core part; and a second bent part that is bent to extend outward from a rear end of the first bent part, wherein the mid-cabinet accommodation part is defined by a rear surface of the display module, the first bent part and the second bent part.

6. The display device according to claim 1, further comprising an end block, wherein ends of the front and rear sheets outwardly extend longer than an end of the core part, and wherein the end block is inserted in-between the front sheet and the rear sheet from an outside of the core part.

7. The display device according to claim 6, wherein the end block comprises:

an inner part; and an outer part disposed outside the inner part, the outer part having a front surface disposed behind a front surface of the inner part to establish a stepped portion, wherein the mid-cabinet accommodation part is defined in a front side of the outer part.

8. The display device according to claim 1, wherein the display module comprises:

a display panel; and a back cover attached to a rear surface of the display panel, wherein the display panel comprises an organic light-emitting display (OLED) panel.

9. The display device according to claim 1, wherein at least one of the front and rear sheets comprises a metal material.

10. The display device according to claim 1, wherein the rear sheet is configured to be thicker in the front-to-rear direction than the front sheet is.

11. The display device according to claim 1, wherein a ratio of a thickness of the core part with respect to a total thickness of the heat dissipation unit in the front-to-rear direction is 40% to 60%.

* * * * *